United States Patent
Kubota et al.

(10) Patent No.: US 9,831,080 B2
(45) Date of Patent: Nov. 28, 2017

(54) METHOD FOR MANUFACTURING SEMICONDUCTOR DEVICE INCLUDING A HEAT TREATMENT STEP

(71) Applicant: Sumitomo Electric Industries, Ltd., Osaka-shi (JP)

(72) Inventors: Ryosuke Kubota, Osaka (JP); Ren Kimura, Osaka (JP); So Tanaka, Osaka (JP); Kazuhito Kobashi, Hitachinaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/310,549

(22) PCT Filed: Mar. 25, 2015

(86) PCT No.: PCT/JP2015/059080
§ 371 (c)(1),
(2) Date: Nov. 11, 2016

(87) PCT Pub. No.: WO2015/174143
PCT Pub. Date: Nov. 19, 2015

(65) Prior Publication Data
US 2017/0076934 A1   Mar. 16, 2017

(30) Foreign Application Priority Data

May 13, 2014   (JP) .................................. 2014-099562

(51) Int. Cl.
*H01L 21/265*   (2006.01)
*H01L 21/02*   (2006.01)
(Continued)

(52) U.S. Cl.
CPC ...... *H01L 21/02027* (2013.01); *H01L 21/027* (2013.01); *H01L 21/3065* (2013.01);
(Continued)

(58) Field of Classification Search
CPC ......... H01L 21/67011; H01L 21/67098; H01L 21/6831; H01L 21/6833; H01L 21/6835; H01L 21/046; H01L 21/324
See application file for complete search history.

(56) References Cited

U.S. PATENT DOCUMENTS

2006/0011610 A1*   1/2006   Kondou ................. H05B 3/143
219/444.1
2011/0111601 A1   5/2011   Okita et al.
(Continued)

FOREIGN PATENT DOCUMENTS

JP   H10-86085 A   4/1998
JP   2001152335 A   6/2001
(Continued)

OTHER PUBLICATIONS

International Search Report in counterpart International Application No. PCT/JP2015/059080, dated Jun. 2, 2015.

*Primary Examiner* — Thanh Y Tran
(74) *Attorney, Agent, or Firm* — Venable LLP; Michael A. Sartori; Miguel A. Lopez

(57) ABSTRACT

A method for manufacturing a semiconductor device includes a step of preparing a SiC substrate, a step of fixing the SiC substrate on an electrostatic chuck and heat-treating the SiC substrate, and a step of performing ion implantation treatment on the SiC substrate fixed on the electrostatic chuck and heat-treated. The step of heat-treating includes an outer circumferential-side chucking step which generates an electrostatic attraction force between an outer circumferential region of the SiC substrate and an outer circumferential portion of the electrostatic chuck, the outer circumferential portion facing the outer circumferential region, and an inner circumferential-side chucking step which is started after the outer circumferential-side chucking step is started, and generates an electrostatic attraction force between an inner (Continued)

circumferential region of the SiC substrate and an inner circumferential portion of the electrostatic chuck, the inner circumferential portion facing the inner circumferential region.

9 Claims, 7 Drawing Sheets

(51) Int. Cl.
    *H01L 21/027*     (2006.01)
    *H01L 21/3065*     (2006.01)
    *H01L 21/324*     (2006.01)
    *H01L 21/67*     (2006.01)
    *H01L 21/683*     (2006.01)
    *H01L 23/00*     (2006.01)
    *H01L 29/66*     (2006.01)
    *H01L 21/04*     (2006.01)
    *H01L 29/16*     (2006.01)
    *H01L 29/04*     (2006.01)

(52) U.S. Cl.
    CPC ...... *H01L 21/324* (2013.01); *H01L 21/67103* (2013.01); *H01L 21/6831* (2013.01); *H01L 21/6833* (2013.01); *H01L 21/6838* (2013.01); *H01L 23/562* (2013.01); *H01L 29/66068* (2013.01); *H01L 21/046* (2013.01); *H01L 29/045* (2013.01); *H01L 29/1608* (2013.01)

(56) References Cited

U.S. PATENT DOCUMENTS

2013/0019797 A1*    1/2013    Tanaka ................ H01L 21/6831
                                                                                      118/50
2013/0100572 A1    4/2013    Shu
2013/0323864 A1*    12/2013    Mo ......................... H01L 22/14
                                                                                      438/17

FOREIGN PATENT DOCUMENTS

JP                  4769335 B2      9/2011
JP                2012-060175 A      3/2012
JP                2013-191601 A      9/2013

* cited by examiner

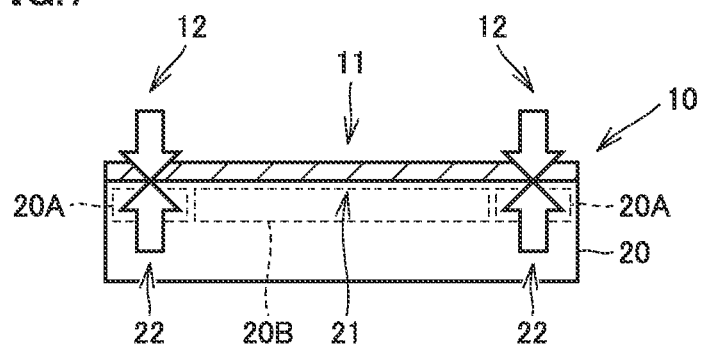
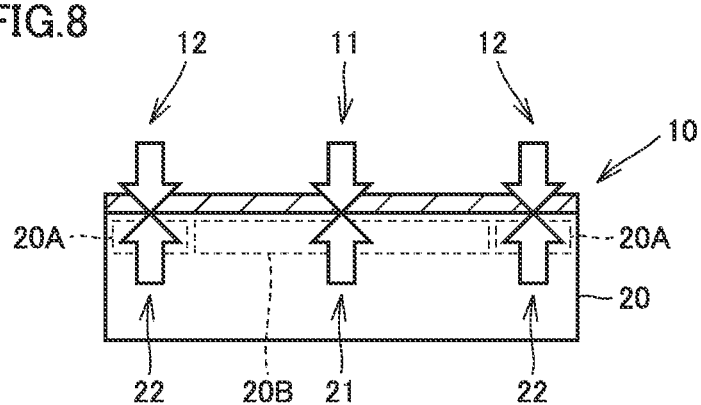

METHOD FOR MANUFACTURING SEMICONDUCTOR DEVICE INCLUDING A HEAT TREATMENT STEP

TECHNICAL FIELD

The present invention relates to a method for manufacturing a semiconductor device, and more particularly to a method for manufacturing a semiconductor device capable of further shortening time of heat treatment of a semiconductor substrate.

BACKGROUND ART

Conventionally, an electrostatic chuck which attracts and holds a semiconductor substrate by an electrostatic attraction force has been used for doping an impurity into a semiconductor substrate made of silicon (Si) or the like and forming a film on the semiconductor substrate. As an electrostatic chuck, for example, an electrostatic chuck integrated with a heater for adjusting the temperature of a semiconductor substrate is disclosed in Japanese Patent Laying-Open. No. 2001-152335 (PTD 1). In PTD 1, electric power is supplied to the heater to heat the electrostatic chuck to a predetermined temperature, and in that state, the substrate is placed at a predetermined position on the electrostatic chuck. Then, a power source for the electrostatic chuck is activated, and a voltage to be applied to an attraction electrode is cumulatively increased until the temperature of the substrate reaches a predetermined reference temperature.

CITATION LIST

Patent Document

PTD 1: Japanese Patent Laying-Open. No. 2001-152335

SUMMARY OF INVENTION

Technical Problem

In an apparatus which fixes a semiconductor substrate on an electrostatic chuck and heat-treats the semiconductor substrate (for example, an ion implantation apparatus, a film formation apparatus, or the like), due to a warping shape inherent to the substrate and the like, heat conduction from the electrostatic chuck to the substrate becomes uneven, increasing warpage of the substrate placed on the electrostatic chuck. Since it is difficult to attract and hold such a substrate having an increased warpage, there is a problem that a long stabilization time is required to eliminate the warpage, and as a result, time of heat treatment is increased. This problem is more significant in particular in a silicon carbide substrate, because the silicon carbide substrate has an inherent warping shape depending on the plane orientation of a crystal.

Accordingly, an object of a method for manufacturing a semiconductor device in accordance with one aspect of the present invention is to further shorten time of heat treatment of a semiconductor substrate.

Solution to Problem

A method for manufacturing a semiconductor device in accordance with one aspect of the present invention includes a step of preparing a semiconductor substrate, a heating step of fixing the semiconductor substrate on a fixing member and heat-treating the semiconductor substrate, and a step of treating the semiconductor substrate fixed on the fixing member and heat-treated. The heating step includes an outer circumferential-side chucking step which generates an attraction force between an outer circumferential region of the semiconductor substrate and an outer circumferential portion of the fixing member, the outer circumferential portion facing the outer circumferential region, and an inner circumferential-side chucking step which is started after the outer circumferential-side chucking step is started, and generates an attraction force between an inner circumferential region of the semiconductor substrate and an inner circumferential portion of the fixing member, the inner circumferential portion facing the inner circumferential region.

Advantageous Effects of Invention

According to the method for manufacturing a semiconductor device in accordance with one aspect of the present invention, time of heat treatment of a semiconductor substrate can be further shortened.

BRIEF DESCRIPTION OF DRAWINGS

FIG. 7 is a schematic view for illustrating a step (S22) of the method for manufacturing the semiconductor device in accordance with the one aspect of the present invention.

FIG. 8 is a schematic view for illustrating a step (S23) of the method for manufacturing the semiconductor device in accordance with the one aspect of the present invention.

DESCRIPTION OF EMBODIMENTS

Description of Embodiments of Present Invention

Figure 1:
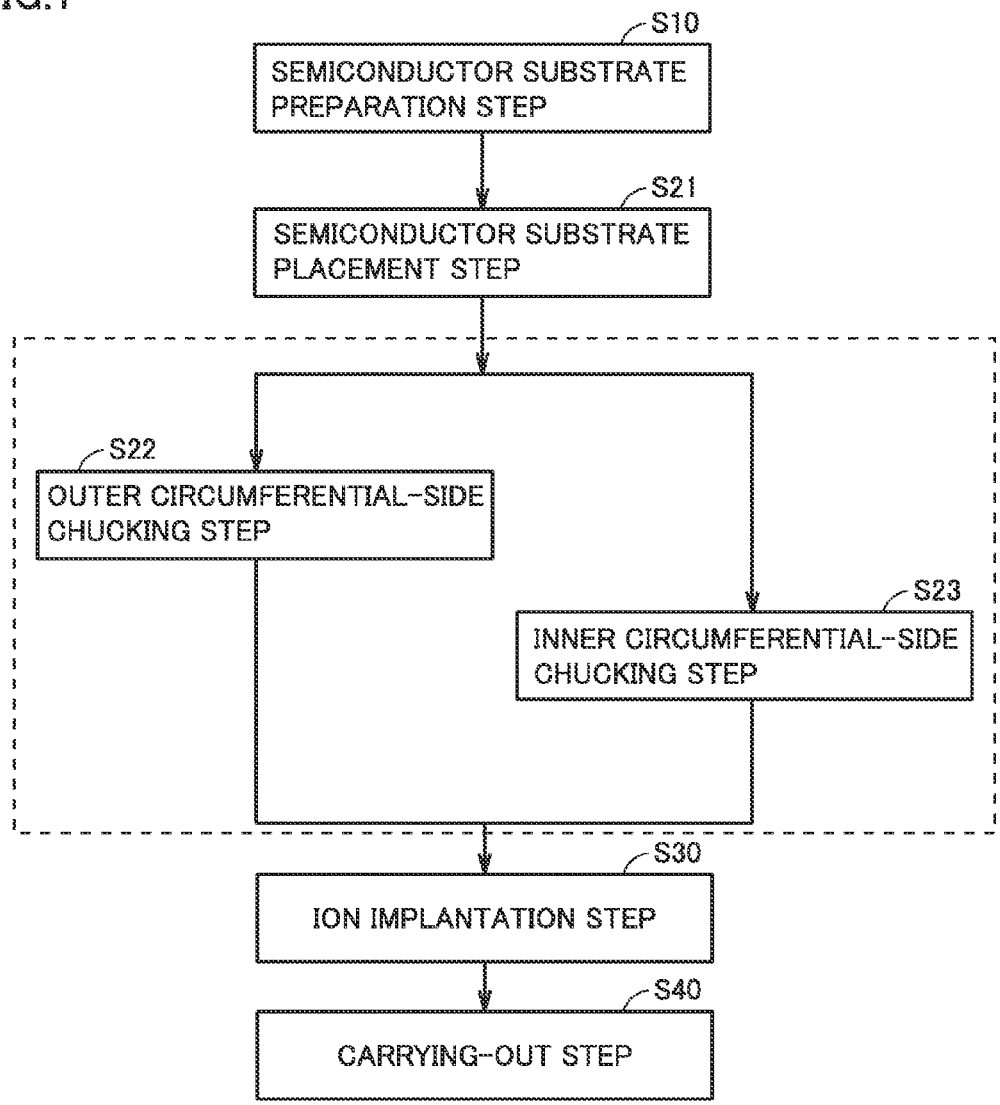
FIG. 1 is a flowchart schematically showing a method for manufacturing a semiconductor device in accordance with one aspect of the present invention.

First, embodiments of the present invention will be described in list form.

(1) A method for manufacturing a semiconductor device in accordance with one aspect of the present invention includes a step of preparing a semiconductor substrate (a SiC substrate 10), a heating step of fixing the semiconductor substrate on a fixing member (an electrostatic chuck 20, a vacuum chuck 30) and heat-treating the semiconductor substrate, and a step of treating the semiconductor substrate fixed on the fixing member and heat-treated. The heating step includes an outer circumferential-side chucking step which generates an attraction force between an outer circumferential region 12 of the semiconductor substrate and an outer circumferential portion 22 of the fixing member, outer circumferential portion 22 facing outer circumferential region 12, and an inner circumferential-side chucking step which is started after the outer circumferential-side chucking step is started, and generates an attraction force between an inner circumferential region 11 of the semiconductor substrate and an inner circumferential portion 21 of the fixing member, inner circumferential portion 21 facing inner circumferential region 11.

In the method for manufacturing the semiconductor device described above, attraction of inner circumferential region 11 is started after attraction of outer circumferential region 12 is started, and the semiconductor substrate is fixed on the fixing member and is heat-treated. Thereby, outer circumferential region 12 of the semiconductor substrate can be attracted and held on the fixing member more reliably, which can suppress occurrence of warpage of the semiconductor substrate when the substrate is placed on the fixing member. Therefore, a long stabilization time taken after the semiconductor substrate is placed on the fixing member until warpage is eliminated is not required, and as a result, time of heat treatment can be further shortened.

(2) In the method for manufacturing the semiconductor device described above, the inner circumferential-side chucking step is started after a temperature of the semiconductor substrate (SiC substrate 10) at outer circumferential region 12 reaches a temperature $T_1$ which is more than or equal to 30% of a heat treatment temperature $T_0$ in the heating step.

When the inner circumferential-side chucking step is started before the temperature of outer circumferential region 12 of the semiconductor substrate reaches temperature $T_1$ described above, it is difficult to fully suppress occurrence of warpage of the semiconductor substrate. Therefore, the inner circumferential-side chucking step is preferably started after the temperature of outer circumferential region 12 reaches a temperature which is more than or equal to 30% of heat treatment temperature $T_0$ described above, and is more preferably started after the temperature of outer circumferential region 12 reaches a temperature which is more than or equal to 40% of heat treatment temperature $T_0$ described above.

(3) In the method for manufacturing the semiconductor device described above, in the step of preparing, the semiconductor substrate (SiC substrate 10) made of silicon carbide and having a first main surface (a main surface 10a) including a (0001) plane and a second main surface (a main surface 10b) including a (000-1) plane is prepared. In the heating step, the semiconductor substrate is fixed on the fixing member in a state where the second main surface faces toward the fixing member (electrostatic chuck 20, vacuum chuck 30).

SiC substrate 10 has an inherent warpage in which a central portion thereof is protrudingly deformed in a thickness direction from main surface 10a toward main surface 10b. Therefore, when SiC substrate 10 is placed with main surface 10b facing toward the fixing member, SiC substrate 10 is in a state where inner circumferential region 11 is in contact with a placement surface 23 and outer circumferential region 12 is apart from placement surface 23 (in a state protruding downward). In this case, heat conduction from the fixing member to SiC substrate 10 becomes uneven, and SiC substrate 10 may be warped such that outer circumferential region 12 is further apart from placement surface 23. In contrast, when attraction of inner circumferential region 11 is started after attraction of outer circumferential region 12 is started to fix SiC substrate 10 as described above, increase of warpage of SiC substrate 10 can be suppressed and time of heat treatment can be shortened.

Here, the description "in a state where the second main surface including a (000-1) plane faces toward the fixing member" includes a state where the second main surface composed of a (000-1) plane faces toward the fixing member, a state where the second main surface having a predetermined off angle (for example, less than or equal to 10°) relative to a (000-1) plane faces toward the fixing member, and the like.

(4) In the method for manufacturing the semiconductor device described above, the fixing member includes electrostatic chuck 20 which generates an electrostatic attraction force between electrostatic chuck 20 and the semiconductor substrate (SiC substrate 10) and fixes the semiconductor substrate, and the fixing member described above is preferably electrostatic chuck 20.

Thereby, the semiconductor substrate can be fixed on the fixing member more firmly using the electrostatic attraction force.

(5) In the method for manufacturing the semiconductor device described above, in the outer circumferential-side chucking step, an electrostatic attraction force is generated between outer circumferential region 12 and outer circumferential portion 22 of electrostatic chuck 20 by applying a voltage to an outer circumferential-side attraction electrode 20A arranged at outer circumferential portion 22. In the inner circumferential-side chucking step, an electrostatic attraction force is generated between inner circumferential region 11 and inner circumferential portion 21 of electrostatic chuck 20 by applying a voltage to an inner circumferential-side attraction electrode 20B arranged at inner circumferential portion 21. The voltages applied to outer circumferential-side attraction electrode 20A and inner circumferential-side attraction electrode 20B have different polarities.

Thereby, the semiconductor substrate can be fixed on the fixing member further firmly using the Johnsen-Rahbek force. It should be noted that the present invention is not limited to the case where voltages having different polarities are applied to outer circumferential-side attraction electrode 20A and inner circumferential-side attraction electrode 20B as described above, and voltages having the same polarity may be applied thereto.

(6) In the method for manufacturing the semiconductor device described above, the fixing member includes vacuum chuck 30 which generates a vacuum attraction force between vacuum chuck 30 and the semiconductor substrate (SiC substrate 10) and fixes the semiconductor substrate, and the fixing member described above is preferably vacuum chuck 30.

Thereby, the semiconductor substrate can be fixed on the fixing member furthermore firmly using the vacuum attraction force.

(7) In the method for manufacturing the semiconductor device described above, in the step of preparing, the semiconductor substrate (SiC substrate 10) having a diameter of more than or equal to 100 mm is prepared.

Since SiC substrate 10 having a large diameter has a large warping amount, warpage of the substrate occurring when the substrate is placed on the fixing member is further increased. Therefore, when SiC substrate 10 has a diameter of more than or equal to 100 mm, it is preferable to start attraction of inner circumferential region 11 after attraction of outer circumferential region 12 is started to suppress occurrence of warpage of the substrate.

(8) In the method for manufacturing the semiconductor device described above, in the step of preparing, the semiconductor substrate (SiC substrate 10) having a thickness of less than or equal to 550 µm (preferably less than or equal to 400 µm, more preferably less than or equal to 300 µm) is prepared.

Since SiC substrate 10 having a small thickness has a large warping amount, warpage of the substrate occurring when the substrate is placed on the fixing member is further increased. Therefore, when the SiC substrate has a thickness of less than or equal to 550 µm, it is preferable to start attraction of inner circumferential region 11 after attraction of outer circumferential region 12 is started to suppress occurrence of warpage of the substrate.

(9) In the method for manufacturing the semiconductor device described above, in the step of treating, ion implantation may be performed on the semiconductor substrate (SiC substrate 10). Thereby, time of ion implantation treatment can be further shortened.

It should be noted that the "step of treating the semiconductor substrate" is not limited to the case where ion implantation is performed, and for example, film formation treatment for an oxide film, a nitride film, a metal film, a semiconductor film, and the like, etching treatment for an oxide film, a nitride film, a metal film, a semiconductor film, and the like, ashing such as organic matter removal, annealing treatment for heat treatment, or the like may be performed. Thereby, time of each treatment can be shortened.

DETAILS OF EMBODIMENTS OF PRESENT INVENTION

Next, specific examples of the method for manufacturing the semiconductor device in accordance with the embodiments of the present invention will be described below with reference to the drawings. In the present specification, an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

Figure 2:
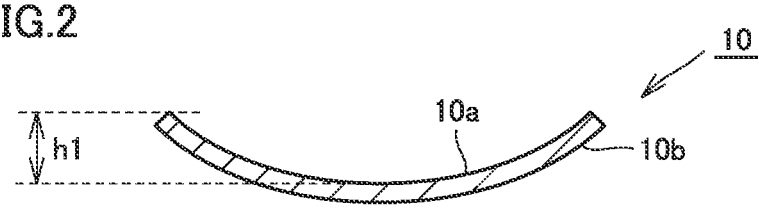
FIG. 2 is a schematic view for illustrating a step (S10) of the method for manufacturing the semiconductor device in accordance with the one aspect of the present invention.

First, a method for manufacturing a semiconductor device in accordance with a first embodiment as one aspect of the present invention will be described. Referring to FIG. 1, first, as a step (S10), a semiconductor substrate preparation step is performed. In this step (S10), referring to FIG. 2, SiC substrate 10 (semiconductor substrate) is obtained for example by slicing an ingot of silicon carbide (SiC) having a polytype of 4H (not shown) to have a predetermined thickness. SiC substrate 10 has main surface 10a (the first main surface) which is a (0001) plane (silicon plane), and main surface 10b (the second main surface) which is a (000-1) plane (carbon plane) opposite to main surface 10a.

The thickness of SiC substrate 10 is less than or equal to 550 µm, preferably less than or equal to 400 µm, and more preferably less than or equal to 300 µm. The diameter of SiC substrate 10 is more than or equal to 100 mm (more than or equal to 4 inches), and preferably more than or equal to 150 mm (more than or equal to 6 inches).

SiC substrate 10 has a shape in which the central portion thereof is protrudingly warped in the thickness direction from main surface 10a toward main surface 10b, and the warping amount is less than or equal to the thickness of the substrate. It should be noted that the warping amount of SiC substrate 10 is defined by a length h1 between the highest point and the lowest point in the thickness direction.

The semiconductor substrate prepared in this step (S10) is not limited to SiC substrate 10, and another semiconductor substrate made of a wide bandgap semiconductor (semiconductor having a bandgap larger than that of silicon) may be prepared. Examples of the wide bandgap semiconductor include gallium nitride (GaN), diamond, and the like, in addition to silicon carbide.

Next, as a step (S20), a semiconductor substrate heating step is performed. In this step (S20), steps (S21) to (S23) described below are performed in order, and SiC substrate 10 is fixed on electrostatic chuck 20 and is heat-treated until its temperature reaches a predetermined treatment temperature.

Figure 3:
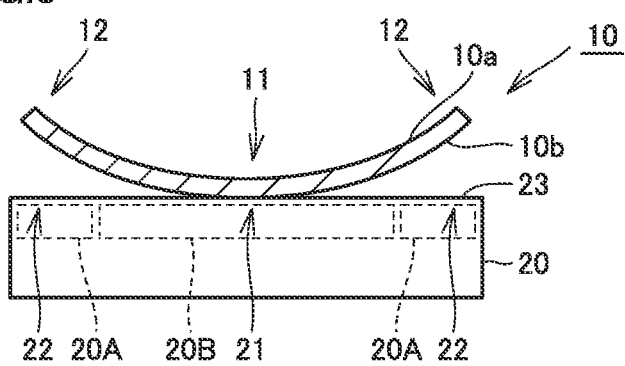
FIG. 3 is a schematic view for illustrating a step (S21) of the method for manufacturing the semiconductor device in accordance with the one aspect of the present invention.

First, as the step (S21), a semiconductor substrate placement step is performed. In this step (S21), referring to FIG. 3, SiC substrate 10 is carried into an ion implantation apparatus (not shown), for example, and is placed on placement surface 23 of electrostatic chuck 20. On this occasion, SiC substrate 10 is placed on electrostatic chuck 20 in a state where main surface 10b faces toward placement surface 23. Thereby, SiC substrate 10 is placed on placement surface 23 in a state where inner circumferential region 11 is in contact with placement surface 23 and outer circumferential region 12 is apart from placement surface 23.

Electrostatic chuck 20 is formed for example by arranging a heater made of carbon (not shown) and electrostatic attraction electrodes (outer circumferential-side attraction electrode 20A and inner circumferential-side attraction electrode 20B) inside a ceramic base material such as boron nitride (p-BN). On the surface of the ceramic base material, a coating layer made of a ceramic material such as boron nitride is formed, and smoothing treatment such as polishing is performed on placement surface 23 to improve adhesion of the substrate. The heater and the electrostatic attraction electrodes are connected with a power source (not shown). Then, by supplying electric power to each of the heater and the electrostatic attraction electrodes, SiC substrate 10 can be fixed on placement surface 23 by an electrostatic attraction force and can be heat-treated.

Figure 4:
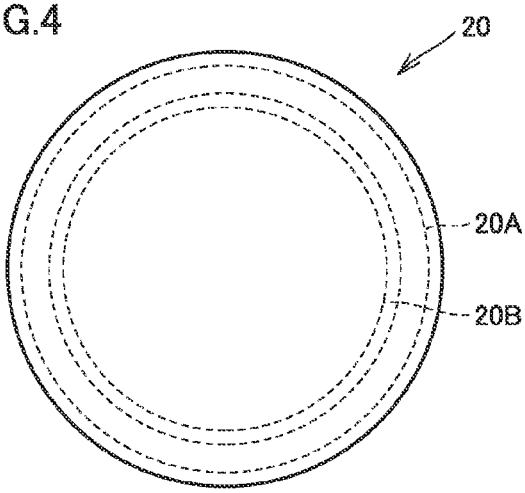
FIG. 4 is a schematic plan view showing one manner of a structure of an electrostatic chuck used for the method for manufacturing the semiconductor device in accordance with the one aspect of the present invention.
Figure 5:
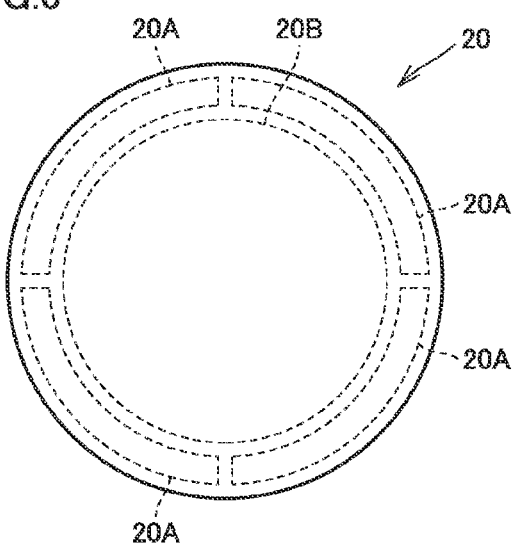
FIG. 5 is a schematic plan view showing another manner of the electrostatic chuck used for the method for manufacturing the semiconductor device in accordance with the one aspect of the present invention.
Figure 6:
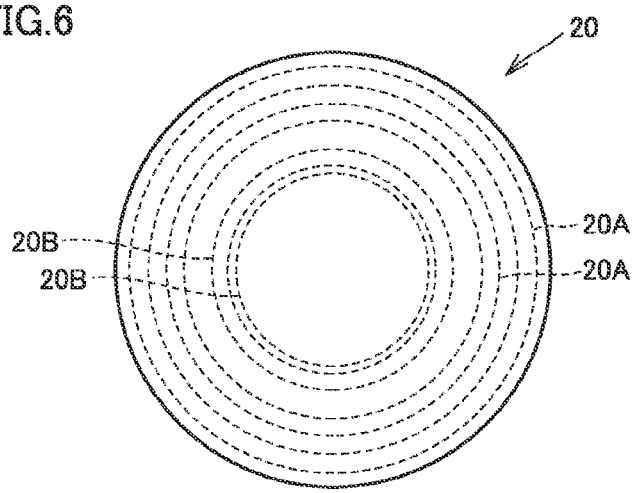
FIG. 6 is a schematic plan view showing still another manner of the electrostatic chuck used for the method for manufacturing the semiconductor device in accordance with the one aspect of the present invention.

FIGS. 4 to 6 are plan views of electrostatic chuck 20 seen from above placement surface 23. Referring to FIG. 4, inner circumferential-side attraction electrode 20B having a circular shape and outer circumferential-side attraction electrode 20A having an annular shape and arranged to surround inner circumferential-side attraction electrode 20B are arranged in electrostatic chuck 20. Voltages having the same polarity may be applicable to outer circumferential-side attraction electrode 20A and inner circumferential-side attraction electrode 20B, or voltages having different polarities may be applicable to outer circumferential-side attraction electrode 20A and inner circumferential-side attraction electrode 20B. It should be noted that the sizes and the positions of inner circumferential-side attraction electrode 20B and outer circumferential-side attraction electrode 20A are not limited to those illustrated in FIG. 4. For example, inner circumferential-side attraction electrode 20B may be arranged in a region of electrostatic chuck 20 which is within one third of the radius of electrostatic chuck 20 from a central portion thereof, and outer circumferential-side attraction electrode 20A may be arranged in a region of electrostatic chuck 20 located radially outside the region which is within one third of the radius of electrostatic chuck 20 from the central portion thereof. In addition, from the viewpoint of further improving the effect of attracting SiC substrate 10 by outer circumferential-side attraction electrode 20A, inner circumferential-side attraction electrode 20B may be arranged in a region of electrostatic chuck 20 which is within three fourths of the radius of electrostatic chuck 20 from the central portion thereof, and outer circumferential-side attraction electrode 20A may be arranged in a region of electrostatic chuck 20 located radially outside the region which is within three fourths of the radius of electrostatic chuck 20 from the central portion thereof.

Referring to FIG. 5, outer circumferential-side attraction electrode 20A may be divided into a plurality of electrodes (for example, four electrodes) in a circumferential direction. In this case, voltages having the same polarity may be applicable to adjacent electrodes, or voltages having different polarities may be applicable to adjacent electrodes. In addition, referring to FIG. 6, each of outer circumferential-side attraction electrode 20A and inner circumferential-side attraction electrode 20B may be divided into a plurality of electrodes (for example, two electrodes) in a radial direction.

Next, a chucking step as the steps (S22) and (S23) is performed. In this step, an outer circumferential-side chucking step (S22) and an inner circumferential-side chucking step (S23) are performed with a time difference being provided therebetween, as described below. First, in the step (S22), referring to FIG. 7, a predetermined voltage is applied to outer circumferential-side attraction electrode 20A arranged at outer circumferential portion 22 of electrostatic chuck 20. Thereby, as indicated by arrows in FIG. 7, an electrostatic attraction force is generated between outer circumferential region 12 of SiC substrate 10 and outer circumferential portion 22 of electrostatic chuck 20, and SiC substrate 10 is fixed.

Further, the step (S23) is performed along with the step (S22) described above. In this step (S23), referring to FIG. 8, after the outer circumferential-side chucking step (S22) described above is started, a predetermined voltage is applied to inner circumferential-side attraction electrode 20B arranged at inner circumferential portion 21 of electrostatic chuck 20. Thereby, as indicated by arrows in FIG. 8, an electrostatic attraction force is generated between inner circumferential region 11 of SiC substrate 10 and inner circumferential portion 21 of electrostatic chuck 20, in addition to the electrostatic attraction force generated by outer circumferential-side attraction electrode 20A, and SiC substrate 10 is fixed.

Figure 9:
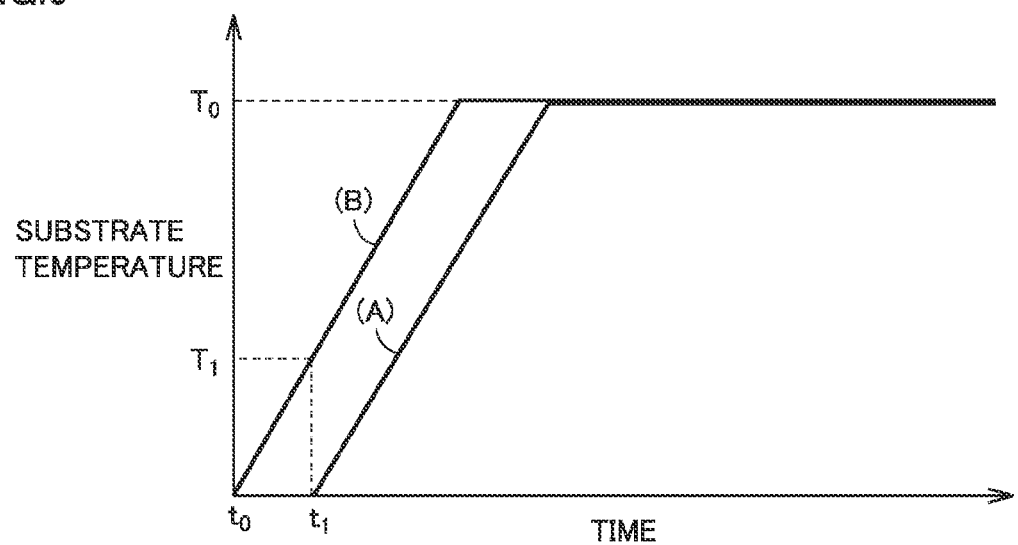
FIG. 9 is a graph showing the relation between time and substrate temperature in the steps (S22) and (S23) of the method for manufacturing the semiconductor device in accordance with the one aspect of the present invention.

Here, timing at which the inner circumferential-side chucking step (S23) is started after the outer circumferential-side chucking step (S22) is started will be described with reference to FIG. 9. FIG. 9 is a graph showing temporal changes of a temperature (A) of inner circumferential region 11 and a temperature (B) of outer circumferential region 12 of SiC substrate 10 in the steps (S22) and (S23). In the graph of FIG. 9, the axis of abscissas represents time and the axis of ordinates represents substrate temperature. In addition, in the graph of FIG. 9, $t_0$ represents a time point at which voltage application to outer circumferential-side attraction electrode 20A is started, and $t_1$ represents a time point at which voltage application to inner circumferential-side attraction electrode 20B is started.

Referring to FIG. 9, voltage application to inner circumferential-side attraction electrode 20B is started after the temperature of SiC substrate 10 at outer circumferential region 12 reaches temperature $T_1$ which is more than or equal to 30% (preferably, more than or equal to 40%) of heat treatment temperature $T_0$ in the semiconductor substrate heating step (S20). Here, the temperature of outer circumferential region 12 refers to a temperature of a region located radially inside the outer circumference of SiC substrate 10 for a distance which is 20% of the radius of SiC substrate 10. This temperature can be measured using, for example, a contact-type temperature sensor having a thermocouple, or a noncontact-type temperature sensor having a radiation thermometer. Further, the temperature of outer circumferential region 12 may be a value measured at one measurement point, or may be an average value of values measured at a plurality of measurement points. Furthermore, each of the voltages to outer circumferential-side attraction electrode 20A and inner circumferential-side attraction electrode 20B may be applied such that the voltage value increases gradually, or may be applied such that the voltage value increases at once to a target voltage value.

Referring to FIG. 8, in the steps (S22) and (S23), voltages having different polarities may be applied to outer circumferential-side attraction electrode 20A and inner circumferential-side attraction electrode 20B, or voltages having the same polarity may be applied to outer circumferential-side attraction electrode 20A and inner circumferential-side attraction electrode 20B. Further, referring to FIG. 5, in the case where outer circumferential-side attraction electrode 20A is divided in the circumferential direction, voltages having the same polarity may be applied to respective outer circumferential-side attraction electrodes 20A, or voltages having different polarities may be applied to adjacent outer circumferential-side attraction electrodes 20A. Further, referring to FIG. 6, in the case where each of outer circumferential-side attraction electrode 20A and inner circumferential-side attraction electrode 20B is divided into a plurality of electrodes in the radial direction, each of the outer circumferential-side chucking step (S21) and the inner circumferential-side chucking step (S22) may be further divided into a plurality of steps and performed.

By performing the steps (S21) to (S23) described above, SiC substrate 10 is fixed on placement surface 23 of electrostatic chuck 20. Then, SiC substrate 10 is heat-treated until its temperature reaches the predetermined treatment temperature.

Figure 10:
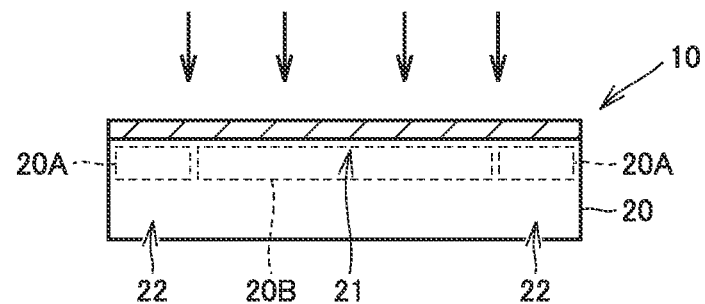
FIG. 10 is a schematic view for illustrating a step (S30) of the method for manufacturing the semiconductor device in accordance with the one aspect of the present invention.

Next, as a step (S30), an ion implantation step is performed. In this step (S30), referring to FIG. 10, ion implantation is performed on SiC substrate 10 fixed on electrostatic chuck 20 and heat-treated until its temperature reaches the predetermined treatment temperature in the step (S20) described above. More specifically, for example, a p-type impurity such as aluminum (Al) or boron (B) or an n-type impurity such as phosphorus (P) is implanted into an epitaxial growth layer (not shown) of SiC substrate 10 (arrows in FIG. 10). Thereby, a p-type or n-type impurity region is formed in the epitaxial growth layer.

Next, as a step (S40), a carrying-out step is performed. In this step (S40), first, the polarities of the voltages applied to outer circumferential-side attraction electrode 20A and inner circumferential-side attraction electrode 20B are reversed to reduce the respective electrostatic attraction forces. Then, after power supply to the attraction electrodes and the heater is stopped, SiC substrate 10 is carried out of electrostatic chuck 20.

After the steps (S10) to (S40) described above are completed, a gate insulating film, a gate electrode, an interlayer insulating film, source/drain electrodes, wiring, and the like are formed on SiC substrate 10, and thereby a semiconductor device such as a MOSFET (Metal Oxide Semiconductor Field Effect Transistor) is completed, and the method for manufacturing the semiconductor device in accordance with the present embodiment is completed. It should be noted that the method for manufacturing the semiconductor device described above is not limited to the process for manufacturing a MOSFET, and is also applicable to the process for manufacturing another semiconductor device such as a diode or an IGBT (Insulated Gate Bipolar Transistor), for example.

Second Embodiment

Next, a method for manufacturing a semiconductor device in accordance with a second embodiment as another aspect of the present invention will be described. Basically, the method for manufacturing the semiconductor device in accordance with the present embodiment is performed by the same steps and exhibits the same effect as those of the method for manufacturing the semiconductor device in accordance with the first embodiment described above. However, the method for manufacturing the semiconductor device in accordance with the present embodiment is different from the method for manufacturing the semiconductor device in accordance with the first embodiment in the way of fixing SiC substrate 10 in a step (S20).

Figure 11:
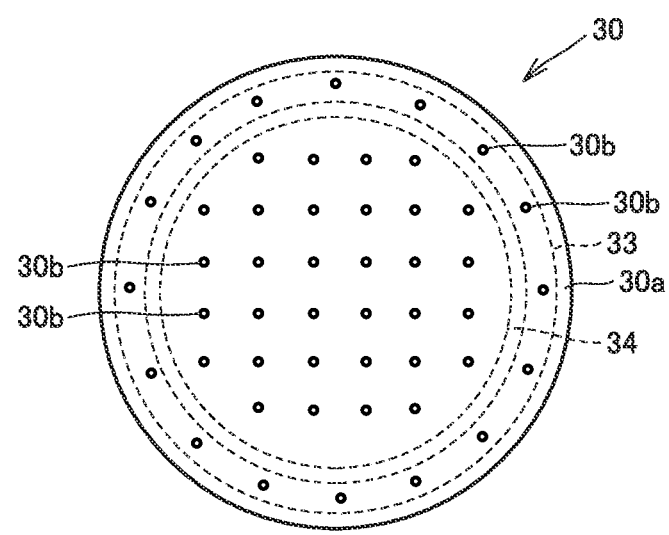
FIG. 11 is a schematic plan view showing one manner of a structure of a vacuum chuck used for a method for manufacturing a semiconductor device in accordance with another aspect of the present invention.

FIG. 11 shows a planar structure of vacuum chuck 30 used as a fixing member in the step (S20). Referring to FIG. 11, vacuum chuck 30 has a placement surface 30a for placing SiC substrate 10 thereon, and placement surface 30a is provided with a plurality of attraction holes 30b. SiC substrate 10 is fixed on placement surface 30a by a vacuum attraction force through attraction holes 30b. Further, vacuum chuck 30 is also provided with an outer circumferential-side attraction region 33 and an inner circumferential-side attraction region 34. In these regions, vacuum attraction forces can be generated at timings different from each other.

Figure 12:
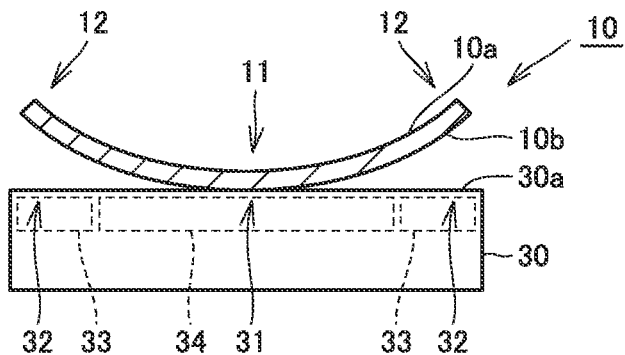
FIG. 12 is a schematic view for illustrating a step (S21) of the method for manufacturing the semiconductor device in accordance with the other aspect of the present invention.
Figure 13:
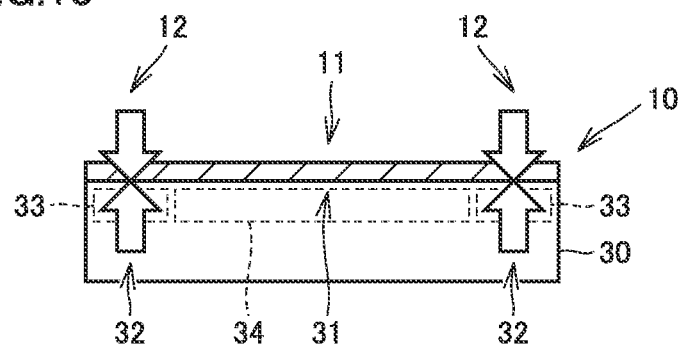
FIG. 13 is a schematic view for illustrating a step (S22) of the method for manufacturing the semiconductor device in accordance with the other aspect of the present invention.

Referring to FIG. 12, first, in a step (S21), SiC substrate 10 is placed on placement surface 30a of vacuum chuck 30. Next, in a step (S22), referring to FIG. 13, a vacuum attraction force is generated between vacuum chuck 30 and SiC substrate 10 at outer circumferential-side attraction region 33 of vacuum chuck 30. Thereby, as indicated by arrows in FIG. 13, a vacuum attraction force is generated between outer circumferential region 12 of SiC substrate 10 and an outer circumferential portion 32 of vacuum chuck 30, and SiC substrate 10 is fixed.

Figure 14:
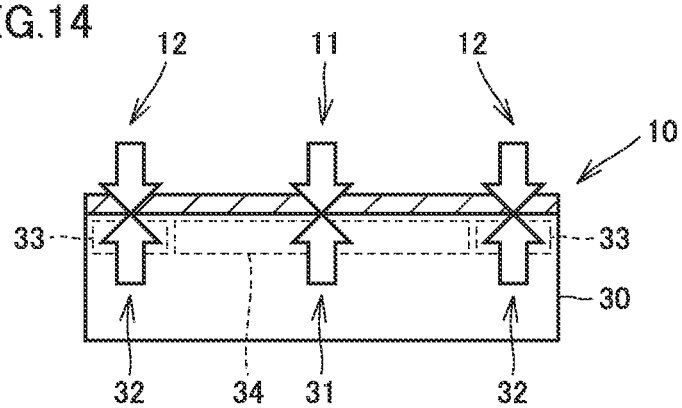
FIG. 14 is a schematic view for illustrating a step (S23) of the method for manufacturing the semiconductor device in accordance with the other aspect of the present invention.

Further, a step (S23) is performed along with the step (S22) described above. In this step (S23), referring to FIG. 14, after the step (S22) described above is started, a vacuum attraction force is generated between vacuum chuck 30 and SiC substrate 10 at inner circumferential-side attraction region 34 of vacuum chuck 30. Thereby, as indicated by arrows in FIG. 14, a vacuum attraction force is generated between inner circumferential region 11 of SiC substrate 10 and an inner circumferential portion 31 of vacuum chuck 30, in addition to the vacuum attraction force at outer circumferential-side attraction region 33, and SiC substrate 10 is fixed. Thus, in the present embodiment, SiC substrate 10 is fixed on placement surface 30a of vacuum chuck 30 by the vacuum attraction forces, and is heat-treated until its temperature reaches a predetermined treatment temperature.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The method for manufacturing the semiconductor device in one aspect of the present invention is particularly advantageously applicable to a method for manufacturing a semiconductor device for which it is required to further shorten time of heat treatment of a semiconductor substrate.

REFERENCE SIGNS LIST

10: silicon carbide (SiC) substrate; 10a, 10b: main surface; 11: inner circumferential region; 12: outer circumferential region; 20: electrostatic chuck; 20A: outer circumferential-side attraction electrode; 20B: inner circumferential-side attraction electrode; 23, 30a: placement surface; 21, 31: inner circumferential portion; 22, 32: outer circumferential portion; 30: vacuum chuck; 30b: attraction hole; 33: outer circumferential-side attraction region; 34: inner circumferential-side attraction region; h1: length.

The invention claimed is:

1. A method for manufacturing a semiconductor device, comprising:
   a step of preparing a semiconductor substrate;
   a heating step of fixing the semiconductor substrate on a fixing member and heat-treating the semiconductor substrate; and
   a step of treating the semiconductor substrate fixed on the fixing member and heat-treated,
   the heating step including
   an outer circumferential-side chucking step which generates an attraction force between an outer circumferential region of the semiconductor substrate and an outer circumferential portion of the fixing member, the outer circumferential portion facing the outer circumferential region, and
   an inner circumferential-side chucking step which is started after the outer circumferential-side chucking step is started, and generates an attraction force between an inner circumferential region of the semiconductor substrate and an inner circumferential portion of the fixing member, the inner circumferential portion facing the inner circumferential region.

2. The method for manufacturing the semiconductor device according to claim 1, wherein the inner circumferential-side chucking step is started after the temperature of the semiconductor substrate at the outer circumferential region reaches a temperature which is more than or equal to 30% of a heat treatment temperature in the heating step.

3. The method for manufacturing the semiconductor device according to claim 1, wherein
in the step of preparing, the semiconductor substrate made of silicon carbide and having a first main surface including a (0001) plane and a second main surface including a (000−1) plane is prepared, and
in the heating step, the semiconductor substrate is fixed on the fixing member in a state where the second main surface faces toward the fixing member.

4. The method for manufacturing the semiconductor device according to claim 1, wherein the fixing member includes an electrostatic chuck which generates an electrostatic attraction force between the electrostatic chuck and the semiconductor substrate and fixes the semiconductor substrate.

5. The method for manufacturing the semiconductor device according to claim 4, wherein
in the outer circumferential-side chucking step, an electrostatic attraction force is generated between the outer circumferential region and the outer circumferential portion of the electrostatic chuck by applying a voltage to an outer circumferential-side attraction electrode arranged at the outer circumferential portion,
in the inner circumferential-side chucking step, an electrostatic attraction force is generated between the inner circumferential region and the inner circumferential portion of the electrostatic chuck by applying a voltage to an inner circumferential-side attraction electrode arranged at the inner circumferential portion, and
the voltages applied to the outer circumferential-side attraction electrode and the inner circumferential-side attraction electrode have different polarities.

6. The method for manufacturing the semiconductor device according to claim 1, wherein the fixing member includes a vacuum chuck which generates a vacuum attraction force between the vacuum chuck and the semiconductor substrate and fixes the semiconductor substrate.

7. The method for manufacturing the semiconductor device according to claim 1, wherein, in the step of preparing, the semiconductor substrate having a diameter of more than or equal to 100 mm is prepared.

8. The method for manufacturing the semiconductor device according to claim 1, wherein, in the step of preparing, the semiconductor substrate having a thickness of less than or equal to 550 μm is prepared.

9. The method for manufacturing the semiconductor device according to claim 1, wherein, in the step of treating, ion implantation is performed on the semiconductor substrate.

* * * * *